US009048428B2

(12) United States Patent
Sanyal et al.

(10) Patent No.: US 9,048,428 B2
(45) Date of Patent: Jun. 2, 2015

(54) ENABLING COMMUNICATION BETWEEN SOURCE AND TARGET MAIL TRANSFER AGENTS

(75) Inventors: Shubhankar Sanyal, Redmond, WA (US); Gregory Gourevitch, Redmond, WA (US); Wilbert De Graaf, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 476 days.

(21) Appl. No.: 13/413,663

(22) Filed: Mar. 7, 2012

(65) Prior Publication Data

US 2013/0238715 A1 Sep. 12, 2013

(51) Int. Cl.
*G06F 15/16* (2006.01)
*H01L 51/00* (2006.01)

(52) U.S. Cl.
CPC ..................... *H01L 51/00* (2013.01)

(58) Field of Classification Search
CPC ......... H04L 51/00; H04L 12/58; H04L 51/18; H04L 51/12; H04N 21/4786
USPC ........... 709/203, 206, 223–224, 232; 715/752
See application file for complete search history.

(56) References Cited

U.S. PATENT DOCUMENTS

| | | | |
|---|---|---|---|
| 7,178,724 B2 | 2/2007 | Tamagno et al. | |
| 7,249,175 B1 * | 7/2007 | Donaldson | 709/225 |
| 7,730,137 B1 | 6/2010 | Toomey | |
| 7,827,303 B1 * | 11/2010 | Lu | 709/237 |
| 7,983,658 B2 | 7/2011 | Gruneberg et al. | |
| 8,458,264 B1 * | 6/2013 | Lee et al. | 709/206 |
| 2003/0115270 A1 * | 6/2003 | Funk et al. | 709/206 |
| 2005/0027879 A1 * | 2/2005 | Karp | 709/238 |
| 2005/0050150 A1 * | 3/2005 | Dinkin | 709/207 |
| 2006/0168024 A1 * | 7/2006 | Mehr et al. | 709/206 |
| 2006/0168057 A1 | 7/2006 | Warren et al. | |
| 2007/0136801 A1 | 6/2007 | Le et al. | |
| 2008/0155691 A1 * | 6/2008 | Fossen et al. | 726/22 |
| 2008/0256179 A1 | 10/2008 | Gorty et al. | |
| 2009/0094334 A1 | 4/2009 | Eriksson | |
| 2009/0177747 A1 * | 7/2009 | Agrawal et al. | 709/206 |

(Continued)

OTHER PUBLICATIONS

Eggendorfer, Tobias, "Application level proxies on bridges", Retrieved at <<http://ieeexplore.ieee.org/stamp/stamp.jsp?tp=&arnumber=4498171>>, Seventh International Conference on Networking, ICN, Apr. 13-18, 2008, pp. 243-248.

*Primary Examiner* — Oanh Duong
(74) *Attorney, Agent, or Firm* — Louise Bowman; Jim Ross; Micky Minhas

(57) ABSTRACT

A system is provided for enabling a source MTA to communicate with a target MTA via an SMTP proxy using SMTP commands for transmitting email messages in a networked environment. An email message may be received by a source mail transport agent (MTA) and the source MTA may route the incoming email message to a target MTA via an SMTP proxy. The SMTP proxy may serve as an intermediary proxy server for enabling the source MTA to communicate with an external and internal target MTA. The SMTP proxy may connect to a target MTA via a connection command, and the SMTP proxy may implement custom SMTP commands to communicate additional information about the source MTA to the target MTA. The system may additionally enable the SMTP proxy to perform actions designated by the SMTP commands and to communicate the result of the SMTP proxy's actions back to the source MTA.

20 Claims, 7 Drawing Sheets

(56) References Cited

U.S. PATENT DOCUMENTS

| | | | |
|---|---|---|---|
| 2009/0198788 A1* | 8/2009 | Taylor | 709/212 |
| 2009/0222922 A1* | 9/2009 | Sidiroglou et al. | 726/23 |
| 2011/0161554 A1* | 6/2011 | Selinger et al. | 711/103 |
| 2011/0307950 A1* | 12/2011 | Eikenberry et al. | 726/12 |
| 2012/0090031 A1* | 4/2012 | Fossen et al. | 726/24 |

* cited by examiner

ENABLING COMMUNICATION BETWEEN SOURCE AND TARGET MAIL TRANSFER AGENTS

BACKGROUND

In a networked environment, email may be routed from a sending client over the network to one or more destination recipient servers via mail transport agents. Conventional email routing involves routing an email message through mail transport agents or servers using simple mail transfer protocol (SMTP). Typically when an email message may be transmitted from a source mail transport agent to a target transport agent via one or more proxy servers. A proxy server may be a mail transport agent which may behave like an OSI layer 7 application layer which may be fairly load heavy on the network.

A proxy server may also be a network proxy that may behave like an OSI layer 4 transport layer which may not be a very flexible proxy server for transmitting SMTP commands. The typical proxy servers may not provide rich management and control over the communication between the target and source mail transport agents (MTAs), and additionally may not enable the use of custom SMTP commands for controlling the behavior of the target and source MTAs and the proxy servers.

SUMMARY

This summary is provided to introduce a selection of concepts in a simplified form that are further described below in the Detailed Description. This summary is not intended to exclusively identify key features or essential features of the claimed subject matter, nor is it intended as an aid in determining the scope of the claimed subject matter.

Embodiments are directed to a system for enabling a source mail transport agent (MTA) to communicate with a target MTA via an SMTP proxy using SMTP commands for transmitting email messages in a networked environment. An email message may be received by a source MTA and the source MTA may route the incoming email message to a target MTA via an SMTP proxy. The SMTP proxy may serve as an intermediary proxy server for enabling the source MTA to communicate with an external and internal target MTA and for controlling the behavior of the MTA's through the use of SMTP commands The SMTP proxy may initiate a connection with a target MTA via "hello" command exchange, and the SMTP proxy may implement custom SMTP commands including, XPROXYFROM, XPROXY, or similar ones to communicate additional information about the source MTA to the target MTA. The system may additionally enable the SMTP proxy to perform actions designated by the SMTP commands (e.g., XPROXYTO) and may communicate the result of the SMTP proxy's actions in response to the control SMTP commands back to the source MTA.

These and other features and advantages will be apparent from a reading of the following detailed description and a review of the associated drawings. It is to be understood that both the foregoing general description and the following detailed description are explanatory and do not restrict aspects as claimed.

DETAILED DESCRIPTION

Figure 1:
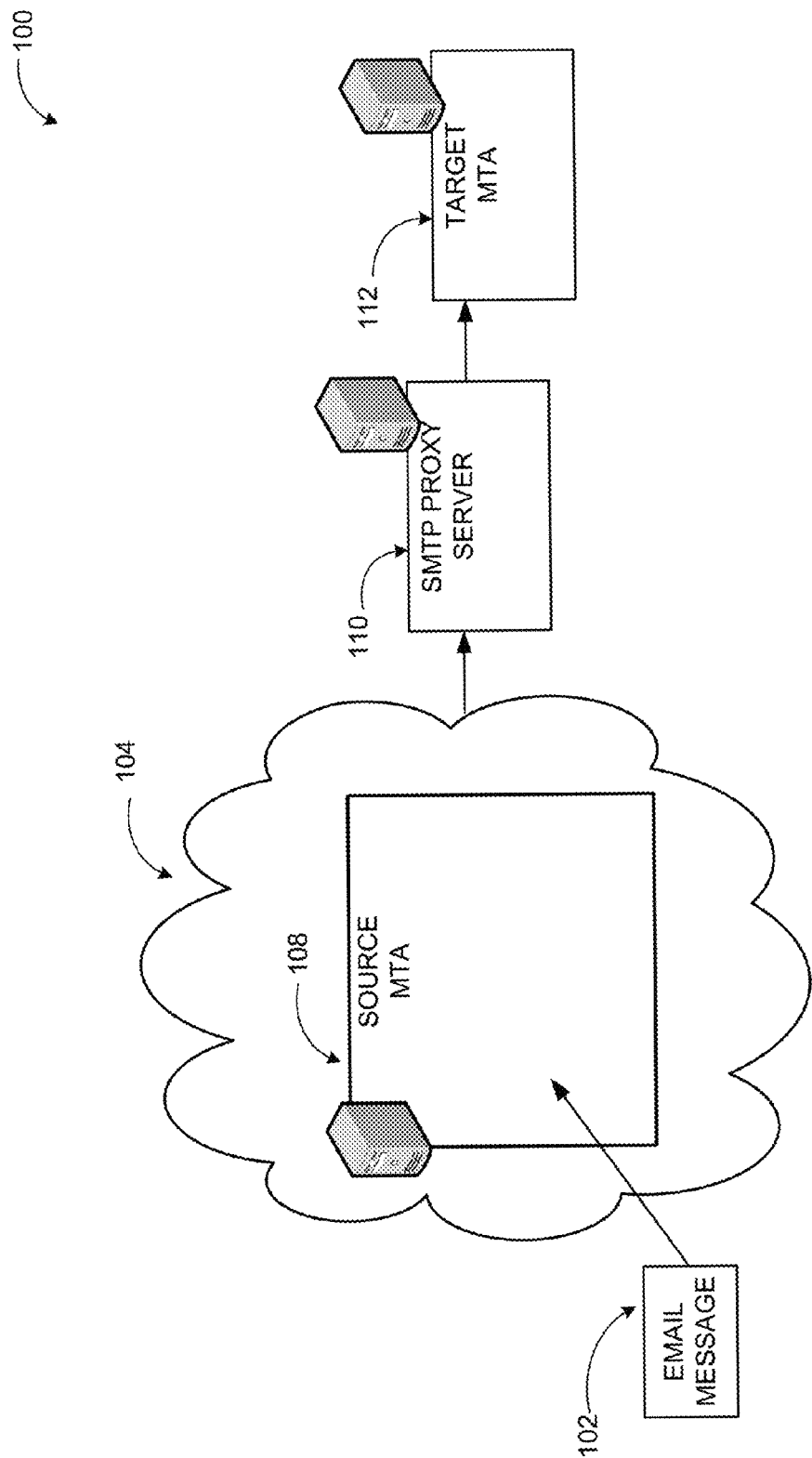
FIG. 1 illustrates a system for email routing over a network, according to embodiments.

As briefly described above, a system is provided for enabling a source MTA to communicate with a target MTA via an SMTP proxy using SMTP commands for transmitting email messages in a networked environment. An email message may be received by a source MTA and the source MTA may route the incoming email message to a target MTA via an SMTP proxy. The SMTP proxy may serve as an intermediary proxy server for enabling the source MTA to communicate with an external and internal target MTA. The SMTP proxy may connect to a target MTA via a connection command, and the SMTP proxy may implement custom SMTP commands to communicate additional information about the source MTA to the target MTA. The system may additionally enable the SMTP proxy to perform actions designated by the SMTP commands and to communicate the result of the SMTP proxy's actions back to the source MTA. In some embodiments, the source MTA may be an out-of-network MTA and the target MTA may be an in-network MTA.

In the following detailed description, references are made to the accompanying drawings that form a part hereof, and in which are shown by way of illustrations specific embodiments or examples. These aspects may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

While the embodiments will be described in the general context of program modules that execute in conjunction with an application program that runs on an operating system on a computing device, those skilled in the art will recognize that aspects may also be implemented in combination with other program modules.

Generally, program modules include routines, programs, components, data structures, and other types of structures that perform particular tasks or implement particular abstract data types. Moreover, those skilled in the art will appreciate that embodiments may be practiced with other computer system configurations, including hand-held devices, multiprocessor systems, microprocessor-based or programmable consumer electronics, minicomputers, mainframe computers, and comparable computing devices. Embodiments may also be practiced in distributed computing environments where tasks are performed by remote processing devices that are linked through a communications network. In a distributed computing environment, program modules may be located in both local and remote memory storage devices.

Embodiments may be implemented as a computer-implemented process (method), a computing system, or as an article of manufacture, such as a computer program product or computer readable media. The computer program product may be a computer storage medium readable by a computer system and encoding a computer program that comprises instructions for causing a computer or computing system to perform example process(es). The computer-readable storage medium can for example be implemented via one or more of a volatile computer memory, a non-volatile memory, a hard drive, a flash drive, a floppy disk, or a compact disk, and comparable media.

Throughout this specification, the term "platform" may be a combination of software and hardware components for enabling a source MTA to communicate with a target MTA via an SMTP proxy using SMTP commands for transmitting email messages in a networked environment agent in a networked environment. Examples of platforms include, but are not limited to, a hosted service executed over a plurality of servers, an application executed on a single computing device, and comparable systems. The term "server" generally refers to a computing device executing one or more software programs typically in a networked environment. However, a server may also be implemented as a virtual server (software programs) executed on one or more computing devices viewed as a server on the network. More detail on these technologies and example operations is provided below.

FIG. 1 illustrates a system for email routing over a network, according to embodiments. In a networked environment, as demonstrated in diagram 100, an email message 102 may be transmitted over a network 104 (e.g., the Internet) to its destination at a recipient server 112 via one or more network servers. The one or more network servers may be for example, mail transport agents and/or proxy mail servers, such as an SMTP proxy 110 or an SMTP mail transport agent (MTA). The email message 102 routing and transmission details may be specified by the Simple Mail Transfer Protocol (SMTP).

In a system according to embodiments, the email message 102 sent from a sender client may be received by a source mail transport agent (MTA) 108 on the network 104, and the source MTA 108 may be route the incoming email message 102 from the sender client to a target MTA 112 via an SMTP proxy 110. The SMTP proxy 110 may be responsible for receiving the email message from the source MTA 108 and proxying, or transmitting, the email message to the target MTA 112. In an example embodiment, SMTP proxy 110 may be configured to perform basic administrative tasks and security functions to reduce threats and spam which may be contained in the email message 102 such as source IP blocking, recipient filtering, and transport layer security (TLS) termination, before transmitting the email message to the target MTA 112.

As described previously, the SMTP proxy 110 may serve as an intermediary proxy server for enabling the source MTA 108 to communicate with the target MTA 112 and for controlling the behavior of the MTA's through the use of SMTP commands as described in RFC (requests for comments) 5321 which defines SMTP standard commands. The SMTP proxy 110 may behave like an Open Systems Interconnection (OSI) layer 4, or transport layer, proxies, and/or OSI layer 7, or application layer, proxies. In an example embodiment, the SMTP proxy 110 may receive SMTP commands from the source MTA 108 and may proxy or transmit the SMTP commands to the target MTA 112. The source MTA 108 may additionally use custom SMTP commands, e.g. control SMTP commands, to control behavior of the SMTP proxy 110. The SMTP proxy 110 may perform the actions designated by the control SMTP commands and may communicate the result of the SMTP proxy's actions in response to the control SMTP commands back to the source MTA 108. In such a scenario, the SMTP proxy 110 may not proxy the control SMTP commands to the target MTA 112. The SMTP commands for controlling the SMTP proxy 110 behavior and communicating with an external target MTA may be configured as an application-to-outbound proxy (AO proxy).

In an additional embodiment, the SMTP commands may be used by the SMTP proxy 110 to communicate additional information about the source MTA 108 to an internal target MTA 112, which may be an application-to-inbound proxy (AI proxy). In a further embodiment, the SMTP proxy 110 may serve as an intermediary proxy server for enabling an end user Mail User Agent (MUA) to communicate with the target MTA 112 through the use of SMTP commands, which may be configured as an application-to-client proxy (AC proxy).

Figure 2:
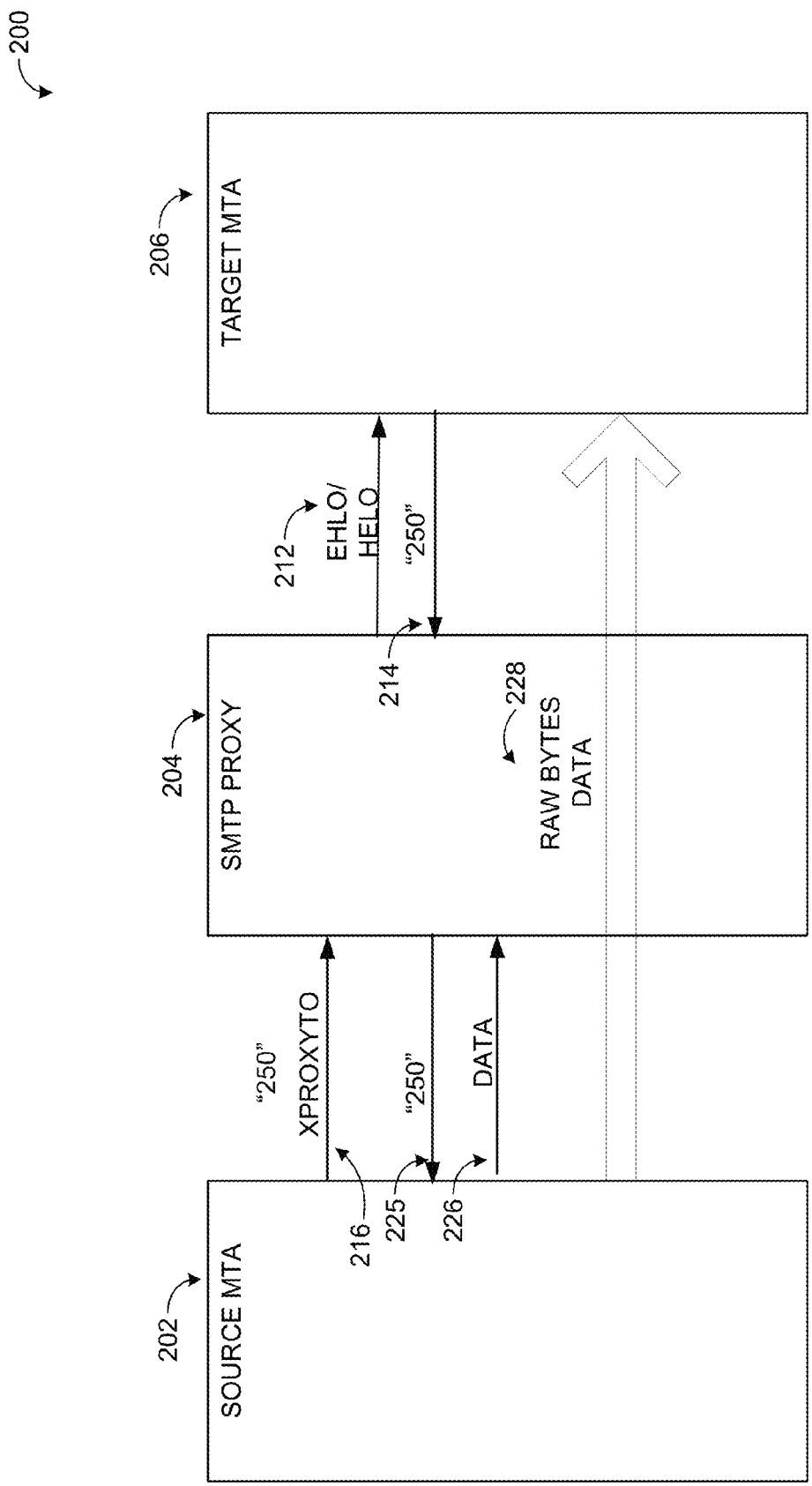
FIG. 2 illustrates an example system for controlling SMTP proxy behavior using SMTP commands, according to embodiments.

FIG. 2 illustrates an example system for controlling SMTP proxy behavior using SMTP commands, according to embodiments. As previously described, the source MTA may use certain SMTP commands, e.g. control SMTP commands, to control behavior of the SMTP proxy 204. The SMTP may perform the actions designated by the control SMTP commands and may communicate the result of the SMTP's actions in response to the control SMTP commands back to the source MTA. The SMTP commands for controlling the SMTP proxy 204 behavior and for communicating with an external target MTA may be configured as an application-to-outbound proxy (AO proxy). An example of such a command may be an XPROXYTO command that may be issued by the source MTA to the SMTP proxy 204.

Diagram 200 illustrates an example SMTP exchange between the target MTA 206 and source MTA 202 via the SMTP proxy 204 utilizing the XPROXYTO command 216. In an example embodiment, a source MTA 202 may send messages to a target MTA 206 that is external to its network through an SMTP proxy 204. The source MTA 202 may use the SMTP proxy 204 for sending outbound messages to the external target MTA 206. The SMTP proxy 204 may perform additional filtering of the outbound messages. In an example scenario, the source MTA 202 may need to communicate information to the SMTP proxy 204 for controlling the behavior of the SMTP proxy 204 and instructing the SMTP proxy 204 how to communicate with the target MTA 206. The source MTA 202 may also need to transmit configurable parameters to the SMTP proxy 204 for enabling custom actions, such as for example, transmitting a security certificate or a mail risk parameter based on which the SMTP proxy 204 may decide which public source IP address to use when connecting to the target MTA 206.

In a system according to embodiments the XPROXYTO command 216 may enable the source MTA 202 to communicate the configurable parameters to the SMTP proxy 204. Upon receipt of the XPROXYTO command 216 by the SMTP proxy 204, the SMTP proxy 204 may establish a connection to the target MTA 206, and issue initial EHLO/HELO commands 212. The EHLO/HELO commands are used to identify an SMTP client to an SMTP server. Their argument field may include the fully-qualified domain name of the SMTP client if one is available. An SMTP client may start an SMTP session by issuing the EHLO command. If the SMTP server supports the SMTP service extensions, it may transmit back a successful response, a failure response, or an error response. Thus, an SMTP client issues a HELO or an EHLO before starting a mail transaction. These commands, and a "250" acknowledgment reply to one of them, confirm that both the SMTP client and the SMTP server are in the initial state, that is, there is no transaction in progress and all state tables and buffers are cleared.

As discussed above, the SMTP EHLO/HELO commands 212 may be a command in the SMTP protocol where the SMTP proxy 204 introduces itself to the target MTA 206. The SMTP proxy 204 may also issue additional commands specified in the parameters of the XPROXYTO command from the source MTA 202. The SMTP proxy 204 may wait for the connection to be established with the target MTA 206 before responding to the XPROXYTO command from the source MTA 202. If the SMTP proxy 204 is not able to connect to the target MTA 206, the SMTP proxy 204 may attempt to reconnect with the target MTA 206 until a connection is established. Additionally if connections with one or more additional target MTA 206s need to be established, the SMTP proxy 204 may attempt to connect with the additional target MTA 206s before responding to the source MTA 202.

In an example embodiment, when all of the connections with the one or more target MTAs 206 have been established, proxy 204 takes on its role as a layer 4 transport layer, the SMTP proxy 204 may not be able to reconnect to the target MTA 206 if the connection drops during the communication, or if there is a communication or protocol error in the communication between the source MTA 202 and the target MTA 206, because when the SMTP proxy 204 behaves as a layer 4 transport layer, the SMTP proxy 204 may not have any information about the state of the data that it is transferring. In a scenario when the connection drops or if there is a communication or protocol error during the communication, then the source MTA 202 may terminate the connection and may attempt to reconnect with the target MTA 206 using the same or a different SMTP proxy 204. Further, if remaining target MTA 206s exist that the SMTP proxy 204 did not initially connect to, the source MTA 202 may attempt to connect to one or more of the remaining target MTA 206s using the SMTP proxy 204. The target MTA 206 may issue an additional XPROXYTO command with instructions to connect to the remaining target MTA 206s that were not initially connected to.

In a system according to embodiments, an example exchange using the XPROXYTO command may be as follows:

TABLE 1

Example protocol exchange with XPROXYTO command

| Communication Between source MTA and SMTP proxy 204 | Communication Between SMTP proxy 204 and target MTA 206 |
|---|---|
| Source MTA: XPROXYTO<br>DESTINATIONS=[10.128.10.246],[10.10.10.1],[10.10.10.2]<br>FORCEHELO=False SHOULDSKIPTLS=False PORT=99<br>REQUIRETLS=True REQUIREOORG=False<br>TLSAUTHLEVEL=DomainValidation RISK=Normal<br>SESSIONID=08CE6D0EBCDE4827 LAST=True | |
| | SMTP proxy fails to connect to the address 10.128.10.246<br>but successfully connects to 10.10.10.1 at port 99 |
| | SMTP Proxy: EHLO |
| | Target MTA (at 10.10.10.1): |
| | 250 - Target Option1 |
| | Target MTA: 250 Target Option2 |
| SMTP Proxy:250 -<br>DESTINATIONLEFT=[10.10.10.2]<br>SMTP Proxy: 250 - Target Option1<br>SMTP Proxy: 250 Target Option2 | |
| SMTP proxy starts proxying the connection from the source MTA to the target MTA | | a response command such as command "250" 214 may be sent to the SMTP proxy 204, and the SMTP proxy 204 may respond to the XPROXYTO command 216 from the source MTA 202. A response to the source MTA 202 may include a positive acknowledgement, such as command "250" 225, of the XPROXYTO command 216 by the SMTP proxy 204. The response to the source MTA 202 may also include commands and options generated by the target MTA 206 in response to the received EHLO/HELO command. The SMTP proxy 204's response to the source MTA 202 may further include whether there were any target MTA 206's that the SMTP did not attempt to connect with and/or failed to connect with.

After sending the response to the source MTA 202, the SMTP proxy 204 may take on the role of a layer 4 transport layer providing a transparent transfer of data between the source MTA 202 and the target MTA 206. The SMTP proxy 204 may receive SMTP DATA 226 for the email message, and the SMTP proxy 204 may transfer raw bytes of data 228 between the source MTA 202 and the target MTA 206 and may not parse the data that it is transferring. Once the SMTP In the above example scenario, the DESTINATIONS and PORT commands may specific the destinations, or target MTAs, which the SMTP proxy 204 may connect to. Additionally the commands FORCEHELO, SHOULDSKIPTLS, REQUIRETLS, REQUIREOORG and TOLSAUTHLEVEL may be settings the SMTP proxy 204 may enforce upon establishing a connection with the target MTA 206. The SESSIONID command may be an identifier of the session between the SMTP proxy 204 and the source SMTP which may be provided for diagnostic purposes.

In another embodiment, as further demonstrated in diagram 200, the LAST command may indicate that this is the last XPROXYTO command 216 for this SMTP exchange. The LAST command may be provided so that if the XPROXYTO command and its specified parameters get too long (as determined by network and/or SMTP proxy 204 settings), it can be split into more than one XPROXYTO command. The RISK command may be a parameter based on which the SMTP proxy 204 may decide to use different public source IP addresses to connect to the target MTA 206. The RISK command may enable the system to protect itself against the likelihood of a good-reputation email message being IP-blocked at the target MTA 206. The target MTA 206 may block an email message if previous bad-reputation email messages have been received from the same IP address. In an example embodiment, the source MTA 202 may be configured to scan the email message to make a determination of the reputation of the email message, and may use different public IP addresses to send the email messages having different reputations.

In an example embodiment, as previously described, the SMTP proxy 204 may take on the role of a layer 4 transport layer, providing a transparent transfer of data between the source MTA 202 and the target MTA 206 after the exchange of the XPROXYTO command. In another embodiment, the SMTP proxy 204 command may be configured to take on the role of a layer 7 application layer, and may enable the SMTP proxy 204 to continue to use the data information provided by the XPROXYTO command.

Figure 3:
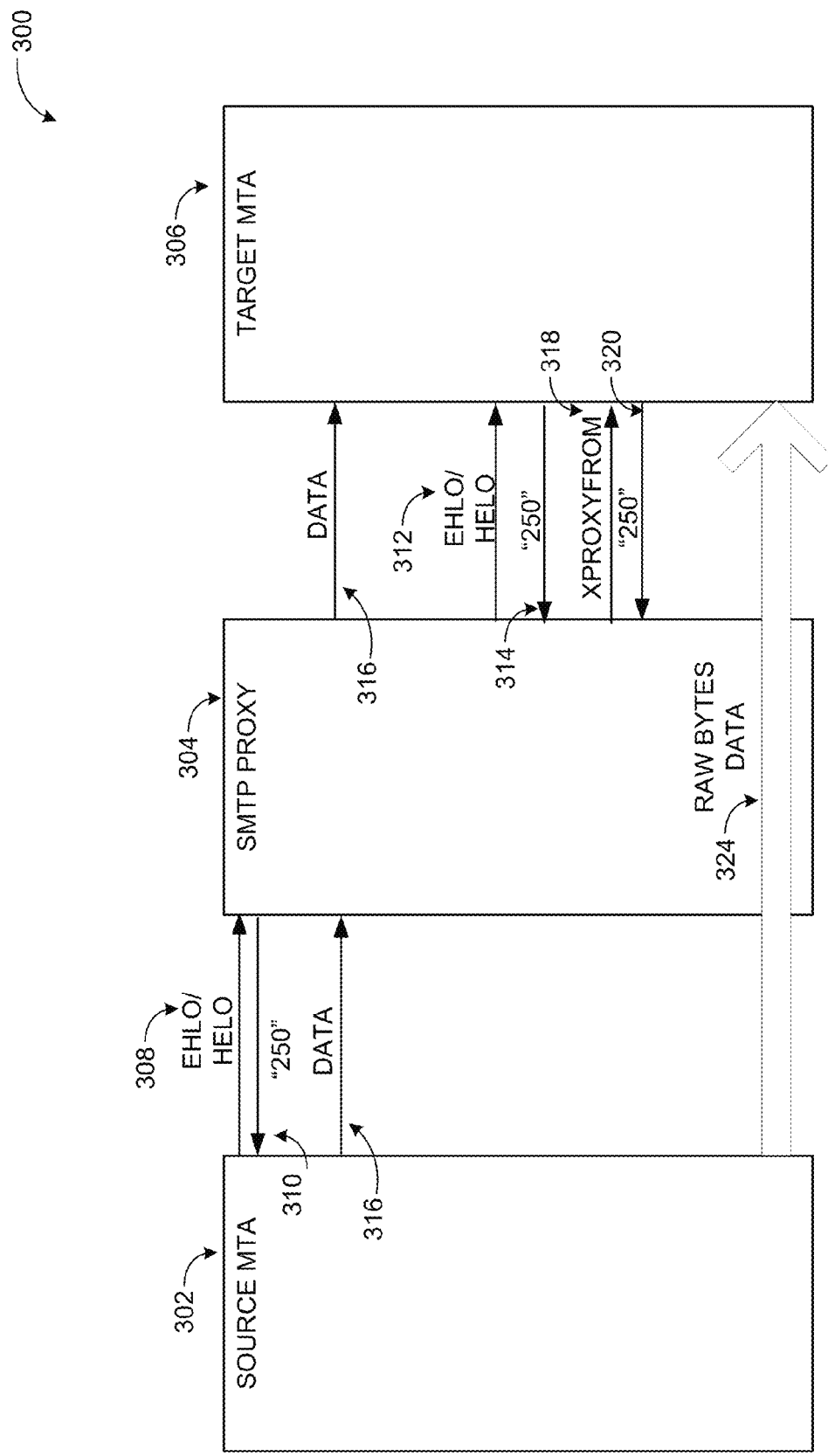
FIG. 3 illustrates an example system for facilitating communication between a source MTA and a target MTA using SMTP commands in a network, according to embodiments.

FIG. 3 illustrates an example system for facilitating communication between a source MTA 302 and a target MTA 306 using SMTP commands in a network, according to embodiments. As previously described, the SMTP commands may be used by the SMTP proxy 304 to communicate additional information from a source MTA 302 to a target MTA 306 in a networked environment, which may be an application-to-inbound proxy (AI proxy). In an application-to-inbound proxy scenario, the source MTA 302 may transmit an email message to a target MTA 306 in the network via an inbound SMTP proxy 304. The SMTP proxy 304 may be configured to transmit the email message from the source MTA 302 to the target MTA 306 within the network, and the SMTP proxy 304 may store the message during transmission. The SMTP proxy 304 may communicate additional information using SMTP commands, which may make the transmission visible and diagnosable while providing access to the source MTA 302 information.

Diagram 300 illustrates an example SMTP exchange between an external source MTA 302 and an internal target MTA 306 via the SMTP proxy 304 utilizing the XPROXY-FROM command 318. In an example embodiment the source MTA 302 may be external to the network, and may connect to an SMTP proxy 304 for connecting to a target MTA 306 within the network. The source MTA 302 may connect to the SMTP proxy 304 for transmitting an email message to the SMTP proxy 304 using SMTP commands. The source MTA 302 may connect to the SMTP proxy 304 via an EHLO/HELO command 308 and may send a connection acknowledgement command, such as command "250" 310 to the source MTA 302. The SMTP proxy 304 may accept the initial SMTP commands up until the transmission of the email message data commands, such as BDAT or DATA commands 316.

In an example embodiment, when the SMTP proxy 304 begins receiving the email message DATA commands 316, the SMTP proxy 304 may temporarily store the email message data in a memory associated with the SMTP proxy 304. The SMTP proxy 304 may identify the internal target MTA 306 that it needs to connect with for transmitting the email message data, and may establish a connection to the target MTA 306, by issuing an initial EHLO/HELO command 312 and awaiting a connection acknowledgement command, such as command "250" 314. After establishing the connection with the target MTA 306, the SMTP proxy 304 may insert an SMTP extension command, such as XPROXYFROM command 318 that may communicate information about the source MTA 302 to the target MTA 306. In response to the XPROXYFROM command 318, the target MTA 306 may respond with a positive acknowledgement, such as command "250" 320, to the SMTP proxy 304. Once the connection has been established and acknowledged by the target MTA 306, the SMTP proxy 304 may transmit the email message commands it received from the external source MTA 302 via transmitting raw bytes of data 324 for the email message received from the source MTA 302 to the target MTA 306. In an example embodiment, the SMTP proxy 304 may also be configured to decide not to transmit the email message if it determines that options requested by the source MTA 302 are not available on the target MTA 306.

An example exchange between the target MTA 306 and the source MTA 302 via the SMTP proxy 304 may be as follows:

SMTP PROXY: "XPROXYFROM SID=08CE780858C360B8IP=10.121.202.151 PORT=25481"

Target MTA: "250 XPROXYFROM ok"

In the above example SID may be the session ID of the source SMTP session on the SMTP proxy 304, which may be included for diagnostic purposes. IP may be the IP address of the source MTA 302 and PORT may be the port being used by the source MTA 302. The target MTA 306 can use this information to correctly log the source MTA 302 details and also to communicate this to any other entities or features that use the source MTA 302 information to make decisions. In an additional embodiment, if a target MTA 306 is unavailable, unable or unwilling to accept the email message, the SMTP proxy 304 may transmit this information back to the source MTA 302 as a response to the DATA/BDAT SMTP command.

Figure 4:
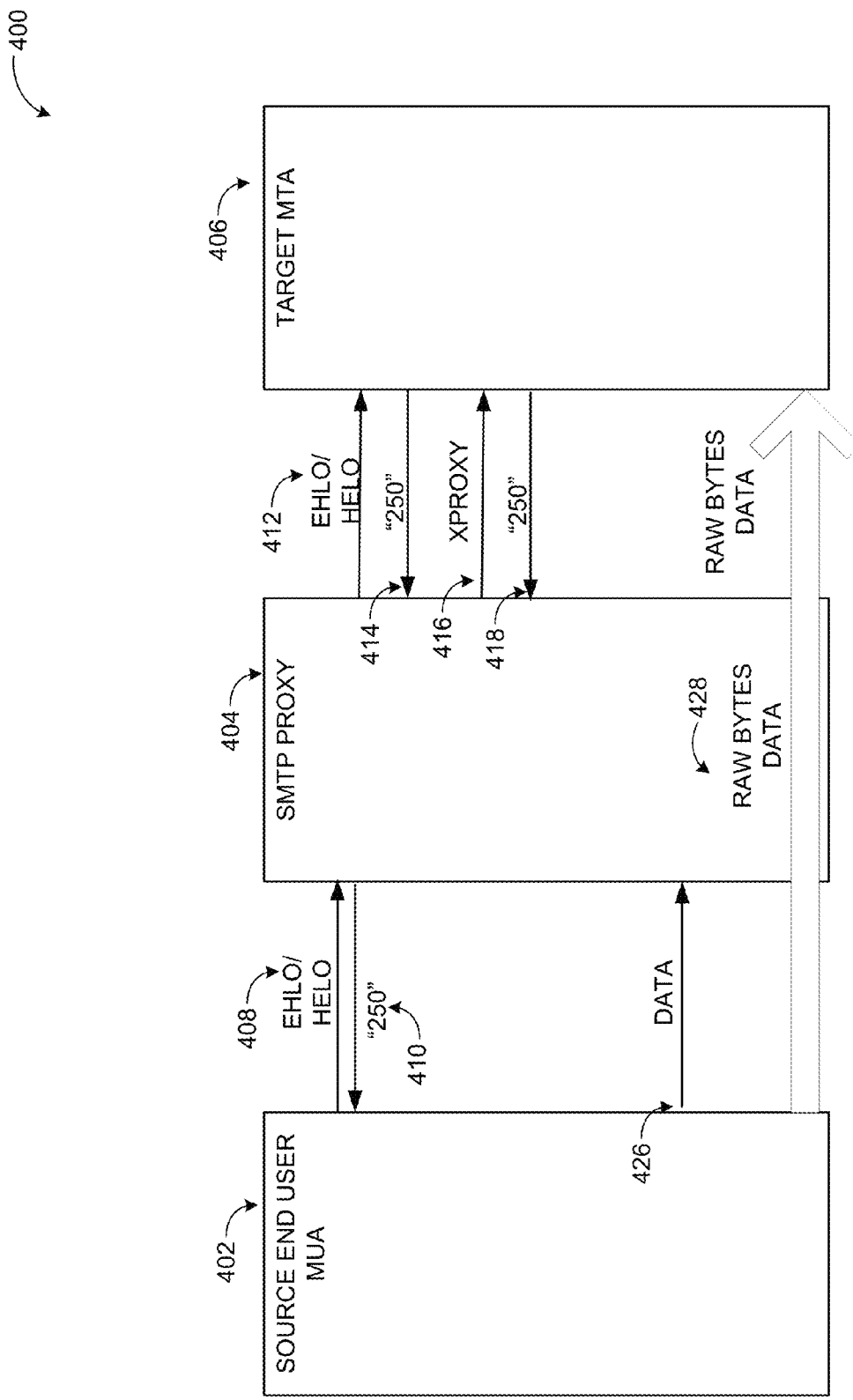
FIG. 4 illustrates an example system for enabling a mail user agent to communicate with a mail transport agent through the use of SMTP commands, according to embodiments.

FIG. 4 illustrates an example system for enabling a mail user agent to communicate with a mail transport agent through the use of SMTP commands in diagram 400. In the illustrated example scenario an end user Mail User Agent (MUA) is communicating with a target MTA 406 through the use of SMTP commands.

In a system according to embodiments, the SMTP proxy 404 may provide an endpoint for the end user MUA 402 to submit authenticated mail without having to know which MTA may actually process the message. The SMTP proxy 404 may determine which MTA to transmit the mail to, and the SMTP proxy 404 may use an SMTP command, which may be XPROXY, to communicate information about the end user MUA 402 to the target MTA 406.

In an example embodiment as demonstrated in diagram 400, end user MUA 402 may issue an EHLO/HELO command 408 and may connect to an SMTP proxy 404 and authenticate the source end user MUA 402 using an SMTP AUTH command The SMTP proxy 404 may send a connection acknowledgement command, such as command "250" 410 to the source end user MUA 402. Based on the identity of the MUA 402 as determined by the authentication, the SMTP proxy 404 may then determine which internal target MTA 406 may process mail sent from the authenticated MUA. The SMTP proxy 404 may issue an EHLO/HELO command 412 and may connect to the target MTA 406. The target MTA may send a connection acknowledgement command, such as command "250" 414 to the SMTP proxy 404. The SMTP proxy 404 may then issue the XPROXY command 416 to communicate details about the end user MUA 402 to the target MTA 406. The target MTA 406 may acknowledge receipt if the XPROXY command via a 250 command 418.

In an example embodiment, after the XPROXY command 416 is sent to the target MTA 406, the SMTP proxy 404 may take on the role of a layer 4 transport layer, providing a transparent transfer of data between the source end user MUA 402 and the target MTA 406. The SMTP proxy 404 may receive may receive SMTP DATA command 426 for the email message, and the SMTP proxy 404 may transfer raw bytes of data 428 between the source end user MUA 402 and the target MTA 406, and may not parse the data that it is transferring.

An example exchange with actual arguments may be as follows:

SMTP Proxy: "XPROXY SID=08CE780858C360B8 IP=10.121.202.151PORT=25481 DOMAIN=URBSOFT.COM"

Target MTA: "250 XPROXY ok"

In the example scenario above, SID may be the session id of the source SMTP session on the SMTP proxy 404 (included for diagnostics), and IP may be the IP address of the source end user MUA. PORT may be the port being used by the source end user MUA, and DOMAIN may be the domain sent along with the EHLO/HELO command by the source end user MUA. The target MTA 406 can use this information to correctly log the source end user MUA 402 details and also communicate this to any other features that use the source end user MUA 402 information to make decisions. In an additional embodiment, if a target MTA 406 is unavailable, unable or unwilling to accept the email message, the SMTP proxy 404 may transmit this information back to the source end user MUA 402 as a response to the AUTH command.

The example systems in FIG. 1 through 4 have been described with specific configurations, applications, and interactions. Embodiments are not limited to systems according to these examples. A system for enabling a source MTA to communicate with a target MTA via an SMTP proxy using SMTP commands for transmitting email messages in a networked environment may be implemented in configurations employing fewer or additional components and performing other tasks. Furthermore, specific commands such as XPROXYTO, XPROXYFROM, etc. are representative examples of custom commands that may be used in a system according to embodiments. Similar commands with different structures and/or names may also be used to implement embodiments.

Figure 5:
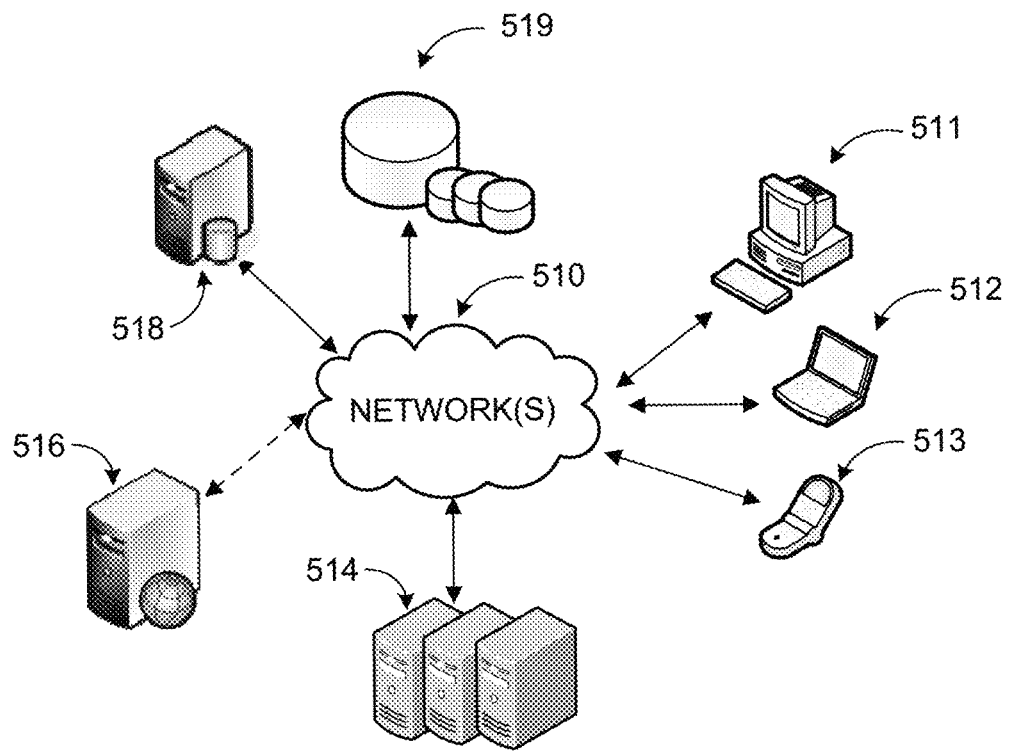
FIG. 5 is a networked environment, where a system according to embodiments may be implemented.

FIG. 5 is an example networked environment, where embodiments may be implemented. A system for enabling a source MTA to communicate with a target MTA via an SMTP proxy using SMTP commands for transmitting email messages in a networked environment may be implemented via software executed over one or more servers 514 such as a hosted service. The platform may communicate with client applications on individual computing devices such as a smart phone 513, a laptop computer 512, or desktop computer 511 ('client devices') through network(s) 510.

Client applications executed on any of the client devices 511-513 may facilitate communications via application(s) executed by servers 514, or on individual server 516. An application executed on one of the servers may storing and partitioning email message data at an external mail transport agent in a networked environment The application may retrieve relevant data from data store(s) 519 directly or through database server 518, and provide requested services (e.g. document editing) to the user(s) through client devices 511-513.

Network(s) 510 may comprise any topology of servers, clients, Internet service providers, and communication media. A system according to embodiments may have a static or dynamic topology. Network(s) 510 may include secure networks such as an enterprise network, an unsecure network such as a wireless open network, or the Internet. Network(s) 510 may also coordinate communication over other networks such as Public Switched Telephone Network (PSTN) or cellular networks. Furthermore, network(s) 510 may include short range wireless networks such as Bluetooth or similar ones. Network(s) 510 provide communication between the nodes described herein. By way of example, and not limitation, network(s) 510 may include wireless media such as acoustic, RF, infrared and other wireless media.

Many other configurations of computing devices, applications, data sources, and data distribution systems may be employed to implement a platform for enabling a source MTA to communicate with a target MTA via an SMTP proxy using SMTP commands for transmitting email messages in a networked environment. Furthermore, the networked environments discussed in FIG. 4 are for illustration purposes only. Embodiments are not limited to the example applications, modules, or processes.

Figure 6:
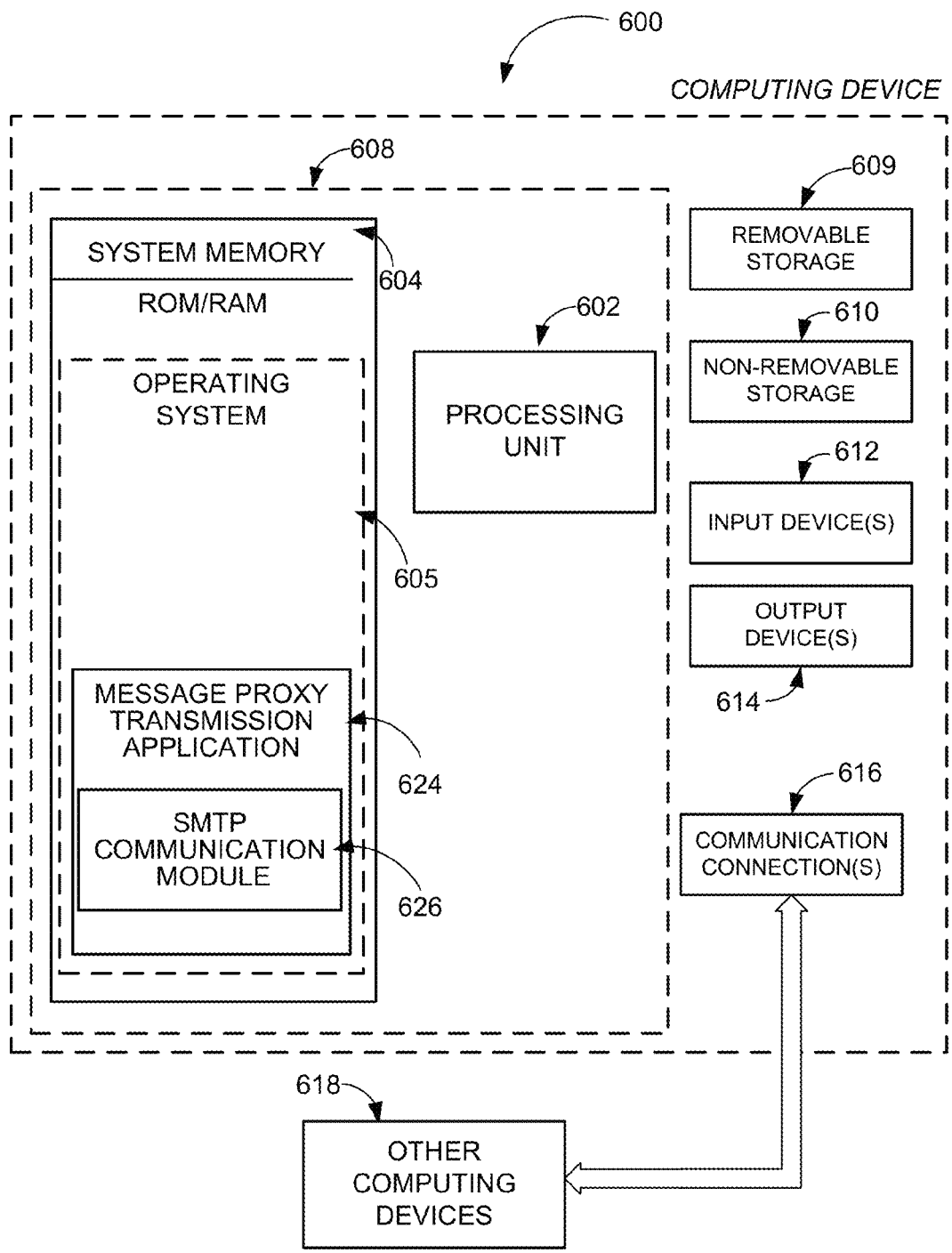
FIG. 6 is a block diagram of an example computing operating environment, where embodiments may be implemented.

FIG. 6 and the associated discussion are intended to provide a brief, general description of a suitable computing environment in which embodiments may be implemented. With reference to FIG. 6, a block diagram of an example computing operating environment for an application according to embodiments is illustrated, such as computing device 600. In a basic configuration, computing device 600 may be any computing device executing an application for enabling a source MTA to communicate with a target MTA via an SMTP proxy using SMTP commands for transmitting email messages in a networked environment according to embodiments and include at least one processing unit 602 and system memory 604. Computing device 600 may also include a plurality of processing units that cooperate in executing programs. Depending on the exact configuration and type of computing device, the system memory 604 may be volatile (such as RAM), non-volatile (such as ROM, flash memory, etc.) or some combination of the two. System memory 604 typically includes an operating system 605 suitable for controlling the operation of the platform, such as the WINDOWS® operating systems from MICROSOFT CORPORATION of Redmond, Wash. The system memory 604 may also include one or more software applications such as a message proxy transmission application 624 and a SMTP communication module 626.

The message proxy transmission application 624 may facilitate transmitting an email message from a source mail transfer agent to one or more target mail transfer agents via an SMTP proxy. Message proxy transmission application 624 may enable a computing device 600 to receive and transmit email message data over a network via one or more proxy transfer servers utilizing SMTP commands. Through the SMTP communication module 626, message proxy transmission application 624 may enable an SMTP proxy to serve as an intermediary proxy server for enabling the source MTA to communicate with the target MTA for transmitting email messages, and for controlling the behavior of the target MTA and the SMTP proxy through the use of SMTP commands as described in RFC (requests for comments) 5321. Message proxy transmission application 624 and SMTP communication module 626 may be separate applications or integrated modules of a hosted service. This basic configuration is illustrated in FIG. 6 by those components within dashed line 608.

Computing device 600 may have additional features or functionality. For example, the computing device 600 may also include additional data storage devices (removable and/or non-removable) such as, for example, magnetic disks, optical disks, or tape. Such additional storage is illustrated in FIG. 6 by removable storage 609 and non-removable storage 610. Computer readable storage media may include volatile and nonvolatile, removable and non-removable media implemented in any method or technology for storage of information, such as computer readable instructions, data structures, program modules, or other data. System memory 604, removable storage 609 and non-removable storage 610 are all examples of computer readable storage media. Computer readable storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and which can be accessed by computing device 600. Any such computer readable storage media may be part of computing device 600. Computing device 600 may also have input device(s) 612 such as keyboard, mouse, pen, voice input device, touch input device, a gesture input capture device, and comparable input devices. Output device(s) 614 such as a display, speakers, printer, and other types of output devices may also be included. These devices are well known in the art and need not be discussed at length here.

Computing device 600 may also contain communication connections 616 that allow the device to communicate with other devices 618, such as over a wired or wireless network in a distributed computing environment, a satellite link, a cellular link, a short range network, and comparable mechanisms. Other devices 618 may include computer device(s) that execute communication applications, web servers, and comparable devices. Communication connection(s) 616 is one example of communication media. Communication media can include therein computer readable instructions, data structures, program modules, or other data. By way of example, and not limitation, communication media includes wired media such as a wired network or direct-wired connection, and wireless media such as acoustic, RF, infrared and other wireless media.

Example embodiments also include methods. These methods can be implemented in any number of ways, including the structures described in this document. One such way is by machine operations, of devices of the type described in this document.

Another optional way is for one or more of the individual operations of the methods to be performed in conjunction with one or more human operators performing some. These human operators need not be collocated with each other, but each can be only with a machine that performs a portion of the program.

Figure 7:
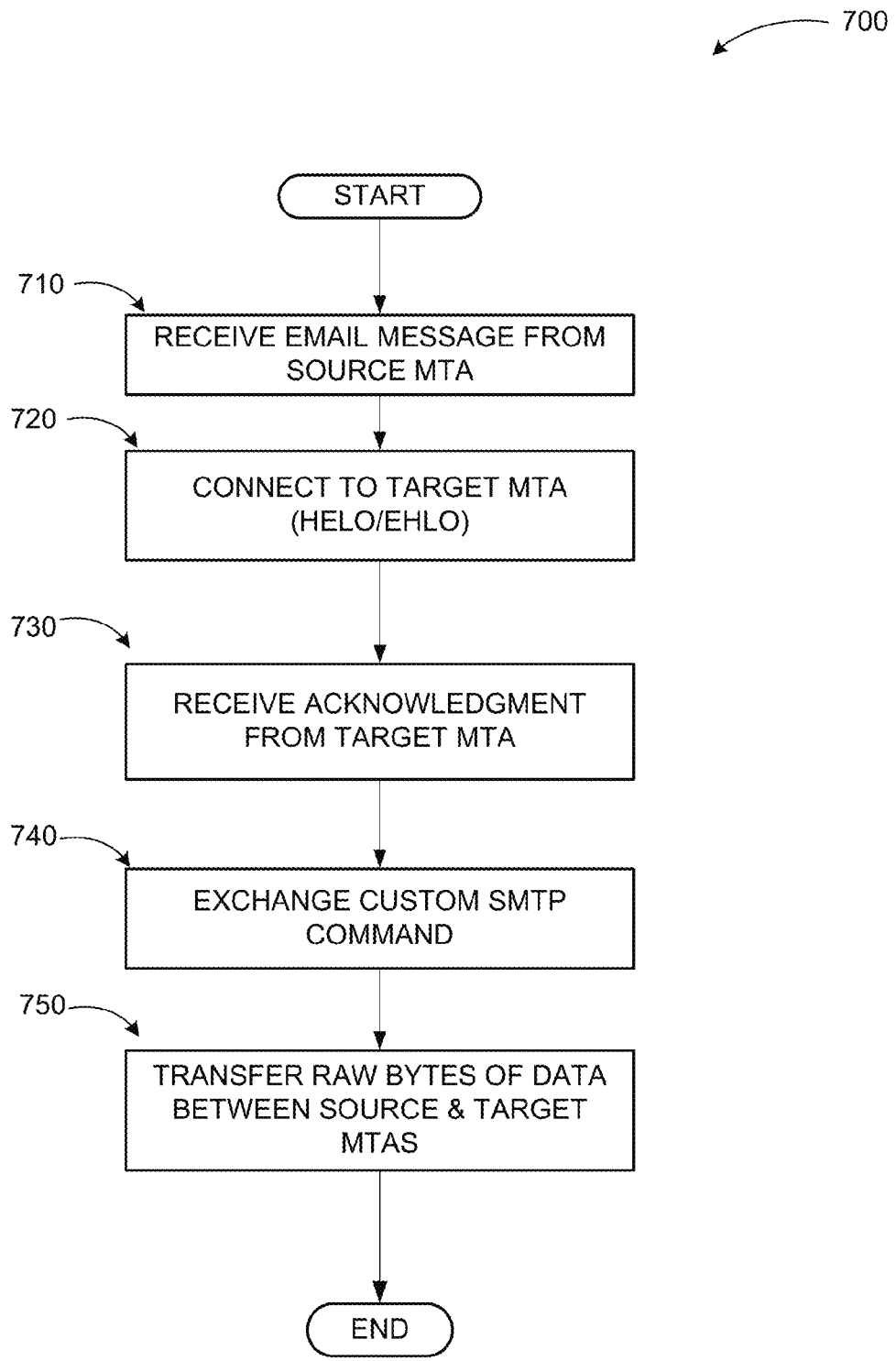
FIG. 7 illustrates a logic flow diagram for process 700 of storing and partitioning email message data at an external mail transport agent in a networked environment to embodiments.

FIG. 7 illustrates a logic flow diagram for process 700 for enabling a source MTA to communicate with a target MTA via an SMTP proxy using SMTP commands for transmitting email messages in a networked environment. Process 700 may be implemented on a computing device or similar electronic device capable of executing instructions through a processor.

Process 700 begins with operation 710, where an SMTP proxy may receive a connection request from a source MTA. A connection request may be a HELO/EHLO command for example. At operation 720, the SMTP proxy may connect to a target MTA. The connection request with the target MTA may be a HELO/EHLO command for example. At operation 730, the SMTP proxy may receive an acknowledgment response from the target MTA, which may be a 250 acknowledgment command for example.

Operation 740 may follow 730, where a custom SMTP command may be exchanged between the SMTP proxy and one of the source MTA/MUA and the target MTA. In an example embodiment, an XPROXYTO command may be issued by the source MTA which may enable the source MTA to communicate configurable parameters to the SMTP proxy. This step may optionally be performed prior to operation 730 where the SMTP proxy establishes a connection with the target MTA. In another embodiment, the SMTP proxy may issue an XPROXYFROM command that may communicate information about the source MTA to the target MTA. In yet another embodiment, the SMTP proxy may issue an XPROXY command to the target MTA to communicate details about the end user MUA to the target MTA.

At operation 750 the SMTP proxy may transfer raw bytes of data for the email message between the source MTA and the target MTA in order to transmit the email message to the target MTA, and the SMTP proxy may not parse the data that it is transferring during the transmission. MTA may store the message data and recipient data contained in the email message in a data store associated with the external MTA.

The operations included in process 700 are for illustration purposes. Storing and partitioning email message data at an external mail transport agent in a networked environment may be implemented by similar processes with fewer or additional steps, as well as in different order of operations using the principles described herein.

The above specification, examples and data provide a complete description of the manufacture and use of the composition of the embodiments. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and embodiments.

What is claimed is:

1. A method executed at least in part in a computing device for enabling communication between a source mail transfer agent (MTA) and a target mail transfer agent (MTA), the method comprising:
   receiving an email message at the source MTA in a network;
   enabling establishment of a connection with the target MTA outside of the network through a Simple Mail Transfer Protocol (SMTP) proxy server;
   exchanging a first proxy command between the source MTA and the SMTP proxy server, wherein the first proxy command includes an application-to-outbound proxy command configured to control a behavior of the SMTP proxy server; and wherein the application-to-outbound proxy command communicates first information of the source MTA to the SMTP proxy server;
   exchanging a second proxy command between the SMTP proxy server and the target MTA, wherein the second proxy command includes an SMTP extension command configured to be sent from an outbound proxy, and wherein the SMTP extension command communicates second information of the source MTA to the target MTA; and
   in response to a determination that the target MTA is one of: unavailable to accept the email message, unable to accept the email message, and unwilling to accept the email message, transmitting, from the SMTP proxy server, the first information to the source MTA as a response to a BDAT SMTP command, wherein the BDAT SMTP command includes an argument that allows the source MTA to determine the byte size of the email message.

2. The method of claim 1, further comprising:
   employing the application-to-outbound proxy command from the target MTA to the SMTP proxy server to indicate at least one from a set of: the source MTA, a port to proxy to, a security certificate, the SMTP extension to be employed, and a mail risk parameter.

3. The method of claim 2, wherein the mail risk parameter enables the SMTP proxy server to select a public target IP address for use in connecting to the source MTA.

4. The method of claim 2, further comprising:
upon successful completion of tasks specified by the application-to-outbound proxy command at the SMTP proxy server, exchanging an EHLO/HELO command set between the SMTP proxy server and the source MTA;
upon receiving source MTA responses to requests specified by the target MTA, providing an application-to-outbound proxy response to the target MTA that includes one or more options advertised by the source MTA; and
if the source MTA options are acceptable to the target MTA, receiving email data from the target MTA at the SMTP proxy server for delivery to the source MTA.

5. The method of claim 4, further comprising:
if connection between the SMTP proxy server and the source MTA is severed during the delivery of the email data, reporting to the target MTA;
terminating a session at the target MTA; and
attempting a reconnect session through one of the SMTP proxy server and another SMTP proxy server to the source MTA employing the application-to-outbound proxy command.

6. The method of claim 1, further comprising:
upon receiving the email message at the SMTP proxy server from the source MTA, accepting one or more proxy commands until an actual transmission of message data and storing the second information in SMTP proxy server memory;
determining the target MTA to proxy to;
replaying to the target MTA the one or more proxy commands received from the source MTA.

7. The method of claim 6, further comprising:
inserting an SMTP extension command that communicates the second information about the source MTA to the target MTA.

8. The method of claim 7, wherein the SMTP proxy server decides not to proxy the email message if it determines options advertised to the source MTA are not available on the target MTA.

9. The method of claim 1, wherein the SMTP proxy server is configured to act as one of a level 4 proxy layer and a level 7 proxy layer during data exchange between the target MTA and the source MTA.

10. The method of claim 1, further comprising:
providing an endpoint for an end user mail user agent (MUA) at the SMTP proxy server to submit an authenticated email message without having to know which MTA is to process the email message, wherein the SMTP proxy server determines which MTA to proxy the email message to.

11. The method of claim 10, further comprising:
determining, at the SMTP proxy server, which a target MTA is to process the email message sent from an authenticated user based on an identity of the user as determined by the authentication;
connecting the MUA of the authenticated user to the target MTA; and
employing an application-to-outbound proxy command to communicate first information about the MUA to the target MTA.

12. A server for enabling communication between source and target mail transfer agents (MTAs), the server comprising:
a memory storing instructions;
a processor coupled to the memory, the processor executing a Simple Mail Transfer Protocol (SMTP) proxy application, wherein the SMTP proxy application is configured to:
receive an email message at the source MTA in a network, wherein the source MTA is configured as an application-to-outbound proxy (AO proxy) to control SMTP proxy application behavior and to communicate with the target MTA;
establish a connection with the target MTA outside of the network;
enable control of the behavior of the SMTP proxy application by the source MTA through one or more proxy commands exchanged between the source MTA and the SMTP proxy application, and between the SMTP proxy application and the target MTA;
employ an application-to-outbound proxy command configured to control another behavior of the SMTP proxy application to communicate first information from the source MTA to the SMTP proxy application to indicate at least one from a set of: the source MTA, a port to proxy to, a security certificate, an SMTP extension to be employed, and a mail risk parameter, wherein the SMTP extension communicates second information of the source MTA to the target MTA;
in response to a determination that the target MTA is one of: unavailable to accept the email message, unable to accept the email message, and unwilling to accept the email message, transmit, from the SMTP proxy application, the first information to the source MTA as a response to a DATA SMTP command, wherein the DATA SMTP command includes a transfer of contents of the email message; and
upon receiving the email message at the SMTP proxy application from the source MTA, employ an SMTP extension command configured to be sent from an outbound proxy to communicate the second information about the source MTA to the target MTA.

13. The server of claim 12, wherein the SMTP proxy application is further configured to:
provide an endpoint for an end user mail user agent (MUA) to submit an authenticated message without having to know which MTA is to process the email message;
employ the application-to-outbound proxy command to communicate the first information about the MUA to the target MTA; and
determine the target MTA to process the email message sent from an authenticated user based on an identity of the user as determined by the authentication.

14. The server of claim 12, wherein the SMTP proxy application is further configured to:
upon receiving source MTA responses to requests specified by the target MTA, provide options advertised by the source MTA in an application-to-outbound proxy response to the target MTA;
if the source MTA initiates the email message, provide requests advertised by the source MTA to the target MTA in the SMTP extension command; and
terminate proxying the email message received from the source MTA, if the requests advertised by the source MTA are not available on the target MTA.

15. The server of claim 14, wherein the server is in one of a cloud-based architecture, a server-client architecture, and a distributed service architecture.

16. The server claim 15, wherein the SMTP proxy application is further configured to:
employ an application-to-outbound proxy command based on a comparison of parameters included in the application-to-outbound proxy command to one or more sizes defined by one of a network and an SMTP proxy setting.

17. The server of claim 16, wherein the SMTP proxy application is further configured to:
employ a "last" parameter indicating that the application-to-outbound proxy command that includes the "last" parameter is the last command in a sequence of the application-to-outbound proxy command.

18. The server of claim 12, wherein the SMTP proxy application is further configured to:
employ a session ID to identify the connection between the target MTA and the source MTA in at least one of the application-to-outbound proxy command and the SMTP extension command.

19. A computer-readable memory device with instructions stored thereon for enabling communication between source and target mail transfer agents (MTAs), the instructions comprising:
receiving an email message at the source MTA in a network, wherein the source MTA is configured as an application-to-outbound proxy (AO proxyl) to control a Simple Mail Transfer Protocol (SMTP) proxy server behavior and to communicate with the target MTA outside of the network;
enabling establishment of a connection with the target MTA through a Simple Mail Transfer Protocol (SMTP) proxy server;
controlling the behavior of the SMTP proxy server by the source MTA through one or more proxy commands exchanged between the source MTA and the SMTP proxy server, and between the SMTP proxy server and the target MTA;
employing an application-to-outbound proxy command configured to control another behavior of the SMTP proxy server to communicate first information from the source MTA to the SMTP proxy server to indicate at least one from a set of: the source MTA, a port to proxy to, a security certificate, an SMTP extension to be employed, and a mail risk parameter, wherein the SMTP extension includes second information about the source MTA to the target MTA;
in response to a determination that the target MTA is one of: unavailable to accept the email message, unable to accept the email message, and unwilling to accept the email message, transmit, from the SMTP proxy server, the first information to the source MTA as a response to one of: a BDAT SMTP command and a DATA SMTP command, wherein the BDAT SMTP command includes an argument that allows the source MTA to determine a byte size of the email message, and wherein the DATA SMTP command includes a transfer of contents of the email message;
upon receiving the email message at the SMTP proxy server from the source MTA, employing an SMTP extension command configured to be sent from an outbound proxy to communicate the second information about the source MTA to the target MTA; and
providing an endpoint for an end user mail user agent (MUA) at the SMTP proxy server to submit an authenticated message without having to know which MTA is to process the email message and employing the application-to-outbound proxy command to communicate the first information about the MUA to the target MTA.

20. The computer-readable memory device of claim 19, wherein the SMTP proxy server is employed to filter the email message that is outbound.

* * * * *